United States Patent [19]
Yata

[11] Patent Number: 4,601,849
[45] Date of Patent: Jul. 22, 1986

[54] ELECTRICALLY CONDUCTIVE ORGANIC POLYMERIC MATERIAL AND PROCESS FOR PRODUCTION THEREOF

[75] Inventor: Shizukuni Yata, Hyogo, Japan

[73] Assignee: Kanebo, Ltd., Tokyo, Japan

[21] Appl. No.: 386,816

[22] Filed: Jun. 9, 1982

[30] Foreign Application Priority Data

Jun. 15, 1981 [JP] Japan ............................. 56-92626
Feb. 5, 1982 [JP] Japan ............................. 57-16358

[51] Int. Cl.$^4$ ............................................. H01B 1/00
[52] U.S. Cl. .................................... 252/500; 252/512; 252/518; 524/80; 524/401; 524/439; 524/412; 524/404; 524/415; 524/422; 524/428; 524/429
[58] Field of Search ............ 252/500, 512, 518; 524/80, 439, 401, 412, 415, 404, 422, 428, 429

[56] References Cited

U.S. PATENT DOCUMENTS

| | | | |
|---|---|---|---|
| 4,204,216 | 5/1980 | Heeger et al. | 252/512 X |
| 4,222,903 | 9/1980 | Heeger et al. | 252/518 |
| 4,501,686 | 2/1985 | Hotta et al. | 252/500 |

*Primary Examiner*—Josephine L. Barr
*Attorney, Agent, or Firm*—Flynn, Thiel, Boutell & Tanis

[57] ABSTRACT

An electrically conductive organic polymeric material is disclosed which comprises (a) an insoluble and infusible substrate with a polyacene-type skeletal structure having a hydrogen/carbon atomic ratio of from 0.60 to 0.15, said substrate being a heat-treated product of an aromatic condensation polymer consisting of carbon, hydrogen and oxygen, and (b) an electron donating doping agent, or an electron accepting doping agent, or both; said material having a higher electrical conductivity than the undoped substrate (a). The electrically conductive organic polymeric material can be produced by a process which comprises heat-treating an aromatic condensation polymer consisting of carbon, hydrogen and oxygen in a non-oxidizing atmosphere by heating it to a temperature of 400° to 800° C. to form a substrate having a hydrogen/carbon atomic ratio of from 0.06 to 0.15, and then doping it with an electron donating doping agent, or an electron accepting doping agent, or a mixture of both, thereby making the electrical conductivity of the doped substrate higher than that of the substrate. The electrically conductive organic polymeric material exhibits excellent oxidation stability and has the electrical conductivity of a semiconductor or conductor.

23 Claims, 6 Drawing Figures

ELECTRICALLY CONDUCTIVE ORGANIC POLYMERIC MATERIAL AND PROCESS FOR PRODUCTION THEREOF

BACKGROUND OF THE INVENTION

1. Field of the Invention

This invention relates to an electrically conductive organic polymeric material and a process for its production. More specifically, it relates to an electrically semiconductive or conductive organic polymeric material useful as an electronics material having excellent oxidation resistance and mechanical strength, which is obtained by doping an insoluble and infusible substrate having a polyacene-type skeleton and composed of a heat-treated product of an aromatic polymer with an electron donating doping agent, or an electron accepting doping agent, or both, and to a process for producing the organic polymeric material.

2. Description of the Prior Art

Polymeric materials have excellent moldability, light weight, and mass-producibility. It has been desired therefore in the electronics industry and many other industrial fields to produce electrically semiconductive or conductive organic polymeric materials by utilizing these excellent properties. It is especially desired to produce organic polymeric semiconductors or conductors which have an electrical conductivity in the range of semiconductors or conductors, possess the properties of n-type or p-type semiconductors as in inorganic semiconductors such as silicon and germanium, and can be applied to diodes, transistors, solar cells, etc. by utilizing their p-n junction.

Early organic polymeric semiconductors or conductors were limited in application because they were difficult to mold into films or sheets and did not have the properties of n-type or p-type extrinsic semiconductors. Recent advances in technology have resulted in the production of organic polymeric materials having the properties of n-type or p-type semiconductors, which have relatively good moldability and can be formed into molded articles, and of which electrical conductivity can be greatly increased by doping them with an electron donating dopant or an electron accepting dopant. Polyacetylene and polyphenylene are known as examples of such organic polymeric materials.

For example, "Gosei Kinzoku" Kagaku Zokan ("Synthetic Metals" chemistry special issue) No. 87, pages 15 to 28, 1980 discloses that by polymerizing acetylene, polyacetylene (having an electrical conductivity of $10^{-9}$ to $10^{-5}$ ohm$^{-1}$cm$^{-1}$) in film form is directly obtained, and by doping it with an electron donating dopant or an electron accepting dopant, an n-type or p-type semiconductor having a greatly increased electrical conductivity can be obtained. Polyacetylene, however, has the defect of being susceptible to oxidation by oxygen. For example, when polyacetylene is left to stand in air, it gradually absorbs oxygen and increases in weight, and with it, turns black brown and finally pale yellow. The rapidity of this oxidation reaction depends upon the crystallinity of polyacetylene. For example, even powdery polyacetylene having a relatively good crystallinity prepared with a Ti(O—n—$C_4H_9$)$_4$—Al($C_2H_5$)$_3$ catalyst system changes in composition to $(CHO_{0.18})_x$ and drastically decreases in electrical conductivity when it is left to stand in air at room temperature for 2,000 hours. Thus, despite its excellent electrical conductivity, polyacetylene finds little practical application because of its poor oxidation stability.

Japanese Laid-Open Patent Publication No. 129443/1980 discloses that an n-type or p-type semiconductor having a greatly increased electrically conductivity can be produced by press-forming polyphenylene (an insulator having an electrical conductivity of about $10^{-12}$ ohm$^{-1}$cm$^{-1}$) obtained by oxidative cationic polymerization of benzene, and doping the resulting molded articles of polyphenylene with an electron donating dopant or an electron accepting dopant. Unlike polyacetylene, polyphenylene has the advantage of possessing relatively good oxidation stability. Since, however, phenylene moieties are linked linearly by single bonds in polyphenylene, a conjugated system because carbon atoms is underdeveloped and there seems to be a limit in the level of its electrical conductivity which can be achieved by using a doping agent. Also, there seems to be a limit to the controllability of electrical properties by a doping agent. In fact, when polyphenylene is doped, for example, with halogen (an electron accepting dopant), the degree of its increase in electrical conductivity is smaller than that of polyacetylene doped with the same amount of halogen. Even when polyphenylene is doped with halogen in the largest dopable amount, its electrical conductivity does not increase beyond $10^{-7}$ ohm$^{-1}$cm$^{-1}$ (see Example 5 of the above-cited Japanese patent document).

SUMMARY OF THE INVENTION

It is an object of this invention to provide an electrically conductive organic polymeric material which exhibits excellent oxidation stability in addition to having the electrical conductivity of a semiconductor or conductor and excellent physical properties.

Another object of this invention is to provide an electrically conductive organic polymeric material comprising a substrate of an insoluble and infusible material having a polyacene type skeletal structure with a developed conjugated system between carbon atoms and an electron donating dopant or an electron accepting dopant.

Still another object of this invention is to provide an electrically conductive organic polymeric material having the properties of a p-type or n-type extrinsic semiconductor.

Yet another object of this invention is to provide an electrically conductive organic polymeric material in the form of a fiber, film or plate or a composite thereof, which has excellent physical properties.

An additional object of this invention is to provide a process for producing the electrically conductive organic polymeric material of this invention.

Other objects and advantages of this invention will become apparent from the following description.

We have now found that the above objects and advantages are achieved in accordance with this invention by an electrically conductive organic polymeric material comprising (a) an insoluble and infusible substrate with a polyacene-type skeletal structure having a hydrogen/carbon atomic ratio of from 0.60 to 0.15, said substrate being a heat-treated product of an aromatic condensation polymer consisting of carbon, hydrogen and oxygen, and (b) an electron donating doping agent, or an electron accepting doping agent, or both, said material having a higher electrical conductivity than the undoped substrate (a).

According to this invention, the electrically conductive organic polymeric material can be produced by heat-treating an aromatic condensation polymer consisting of carbon, hydrogen and oxygen by heating it to a temperature of 400° to 800° C. in a non-oxidizing atmosphere to form a substrate having a hydrogen/carbon atomic ratio of from 0.60 to 0.15, and then doping the substrate with an electron donating doping agent or an electron accepting doping agent, or both, thereby making the electrical conductivity of the polymeric material higher than that of the substrate.

BRIEF DESCRIPTION OF THE ACCOMPANYING DRAWINGS

DETAILED DESCRIPTION OF THE INVENTION

Figure 1:
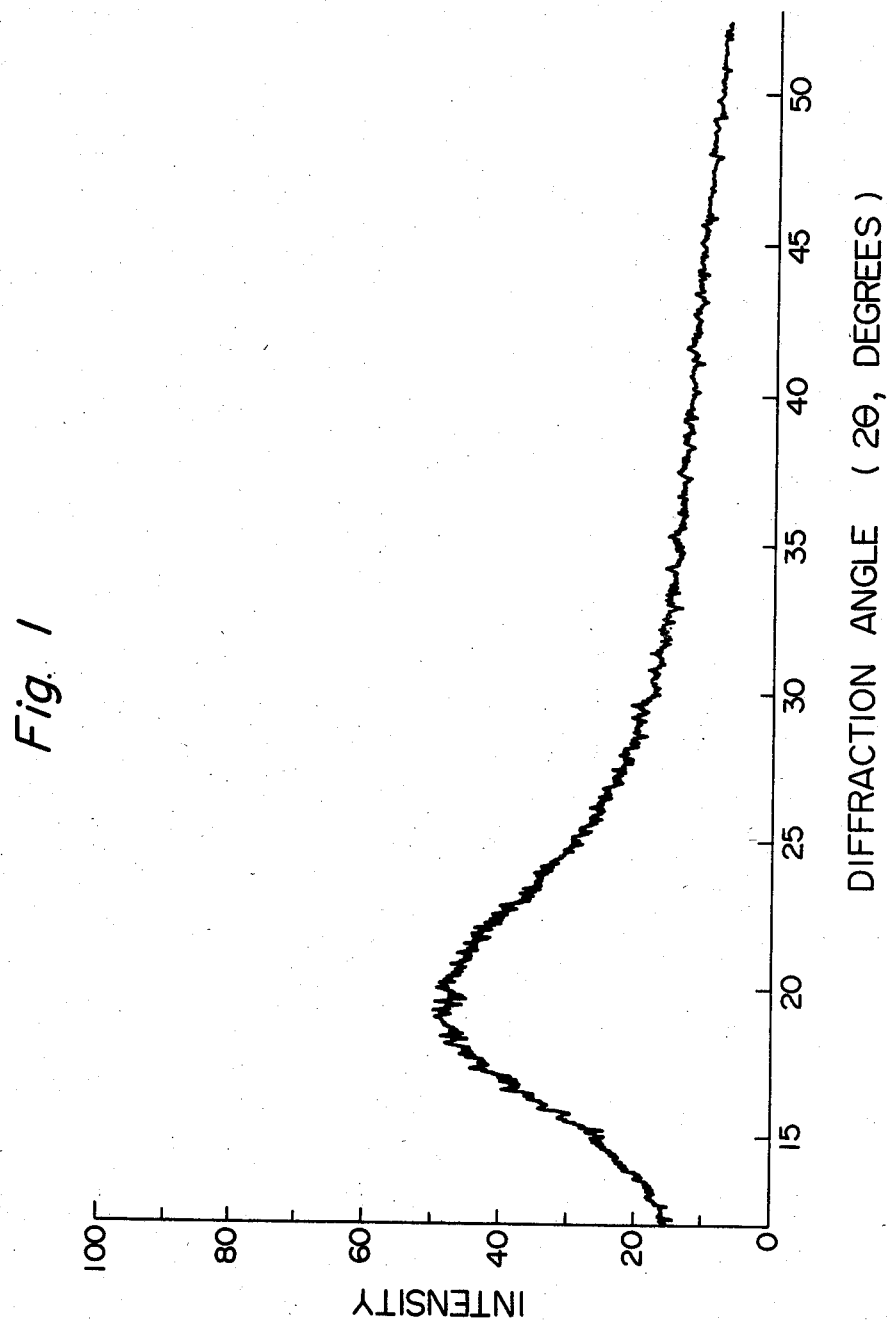
FIG. 1 is an X-ray diffraction pattern of a powder of a cured phenolic resin which is one example of the aromatic condensation polymer used in the process of this invention.

It has been known that when a phenol-formaldehyde condensate obtained by the reaction of phenol with formaldehyde is heated to a temperature of 400° to 800° C. in vacuum or in a non-oxidizing atmosphere, water vapor ($H_2O$) is first generated and then decomposition gases such as hydrogen, methane and carbon monoxide are generated, whereby in the heat-treated condensate, there is developed an area of a structure in which a benzene ring is directly bonded to an adjacent benzene ring through two ring carbon atoms and thus at least several benzene rings are directly linked to each other (this structure is referred to as a polyacene structure) ["Carbon", vol. 19, pages 89–94, 1981, Pergamon Press Ltd.].

It is also known that a phenol-formaldehyde condensate obtained by the reaction of a phenol such as phenol or xylenol (e.g., 3,5-dimethylphenol) with formaldehyde is an electric insulator, but when it is heated to a temperature of at least about 500° C., it gradually develops a cyclic structure in the coarse of this heat-treatment and becomes electrically conductive, with the result that the heat-treated product shows the properties of an intrisic semi-conductor ["Kobunshi", Vol. 9, page 962, 1960; and Report No. 74 of Shigen Gijyutsu Shikensho, page 102, March 1969].

We have unexpectedly found that an insoluble and infusible substrate of a polyacene-type skeletal structure having a hydrogen/carbon atomic ratio of from 0.60 to 0.15, preferably from 0.50 to 0.25, which is a heat-treated product of an aromatic condensation polymer consisting of carbon, hydrogen and oxygen can be doped with an electron donating dopant and/or an electron accepting dopant, and as a result of the doping, the electrical conductivity of the doped material is much higher than that of the undoped substrate.

Condensation products formed between aromatic hydrocarbon compounds having a phenolic hydroxyl group and aldehydes are suitable as the aromatic condensation polymer consisting of carbon, hydrogen and oxygen used in the process of this invention. Phenols such as phenol, cresol and xylenol are suitable as the aromatic compounds, but these are not limitative examples. There can also be used methylenebisphenols of the following formula

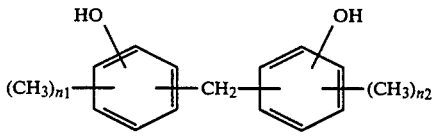

wherein $n_1$ and $n_2$ may be the same or different, and are integers of 0 to 2, hydroxy-biphenyls and hydroxynaphthalenes. For practical purposes, phenols, especially phenol, are preferred.

Examples of the aldehydes are formaldehyde, acetaldehyde and furfural. Formaldehyde is preferred.

The phenol-formaldehyde condensate may be a novolak, a resol or a mixture of these.

According to this invention, a modified aromatic condensation polymer obtained by using an aromatic hydrocarbon free from a phenolic hydroxyl group, such as xylene or toluene, in place of a part of the aromatic hydrocarbon having a phenolic hydroxyl group can also be used as the aromatic condensation polymer consisting of carbon, hydrogen and oxygen. There can also be used an aromatic condensation polymer corresponding to a condensate of an aromatic compound containing an oxygen atom as a hetero atom and an aldehyde, such as a condensate of furfuryl alcohol corresponding to a condensate of furan and formaldehyde.

Advantageously, the aromatic condensation polymer consisting of carbon, hydrogen and oxygen is heat-treated after it is molded into fibers, a film, a plate, or a composite of these.

The aromatic condensation polymers as such have a hydrogen/carbon atomic ratio of usually at least 0.9, and scarcely below 0.8.

According to this invention, the aromatic condensation polymer is heated gradually in a non-oxidizing atmosphere (including vacuum) to a suitable temperature within the range of 400° to 800° C., preferably 450° to 750° C., especially preferably 500° to 700° C., to form a heat-treated product (substrate) having a hydrogen/carbon atomic ratio (to be abbreviated H/C) of from 0.60 to 0.15, especially preferably 0.50 to 0.25. The heat-treated product is insoluble and infusible.

The considerably great decrease of the hydrogen/carbon atomic ratio of the condensation polymer by heat-treatment is believed to show that, as disclosed in the above-cited literature reference, a polyacene-type structure consisting of a multiplicity of linked benzene rings grows in the heat-treated product.

That the heat-treated product used in this invention, i.e. the insoluble and infusible substrate, contains a considerably grown polyacene-type structure (uniformly, it is believed) is substantiated by the fact that both the hydrogen/carbon atomic ratio and oxygen/carbon atomic ratio (O/C) of the substrate based on its elemental analysis decrease considerably greatly from those of the condensation polymer before the heat-treatment, and also by its X-ray diffraction pattern and infrared absorption spectrum.

Aromatic condensation polymers usually have an O/C of at least 0.1, and scarcely show an O/C of less than 0.08. By heating them as above, their O/C decreases as does H/C. The substrate used in this invention preferably has an O/C of not more than 0.06, especially not more than 0.03. The fact that the O/C of the substrate is much smaller than that of the aromatic condensation polymer before the heat-treatment supports the fact that oxygen, for example the phenolic hydroxyl group, of the condensation polymer is decomposed and removed and its structure changes to a polyacene-type structure.

As can be seen from FIG. 1, the aromatic condensation polymer used in this invention is characterized by having an X-ray diffraction pattern ($CuK_\alpha$ radiation) in which a main peak exists at $2\theta = 20°$ or less, and no peak exists at $2\theta = 41°$–$46°$.

It is said that in the X-ray diffraction, the main peak appearing at $2\theta = 24°$ or less corresponds to the average distance between planar polyacene-type molecules, and the peak appearing at $2\theta = 41°$–$46°$ corresponds to the average size of the benzene rings of the molecules of the polyacene-type structure ["Tanso Zairyo Nyumon" (Guide to Carbon Materials), page 12, to page 21, 1972, by the Association of Study of Carbon Materials].

Figure 2:
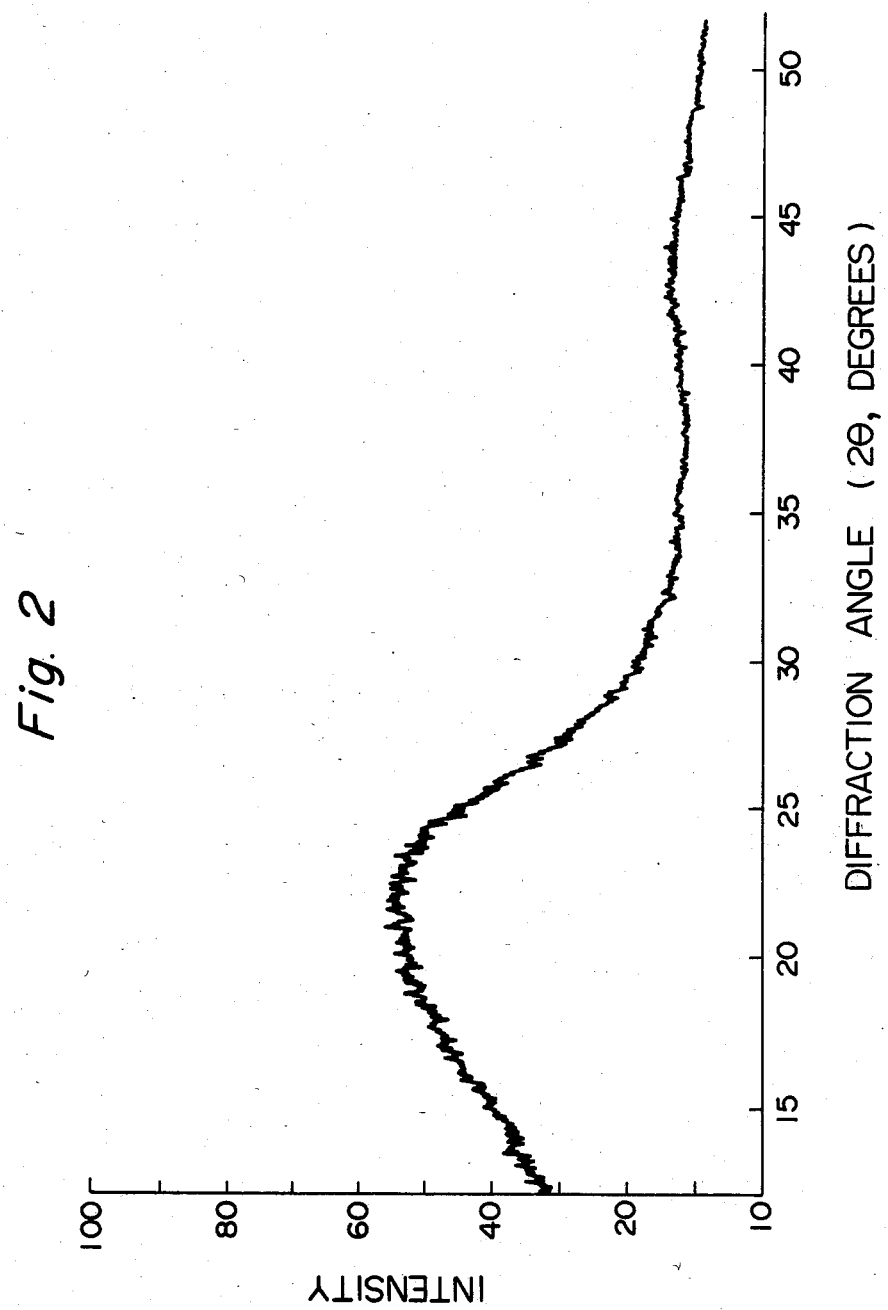
FIGS. 2 and 3 are X-ray diffraction patterns of insoluble and infusible substrates used in this invention.
Figure 3:
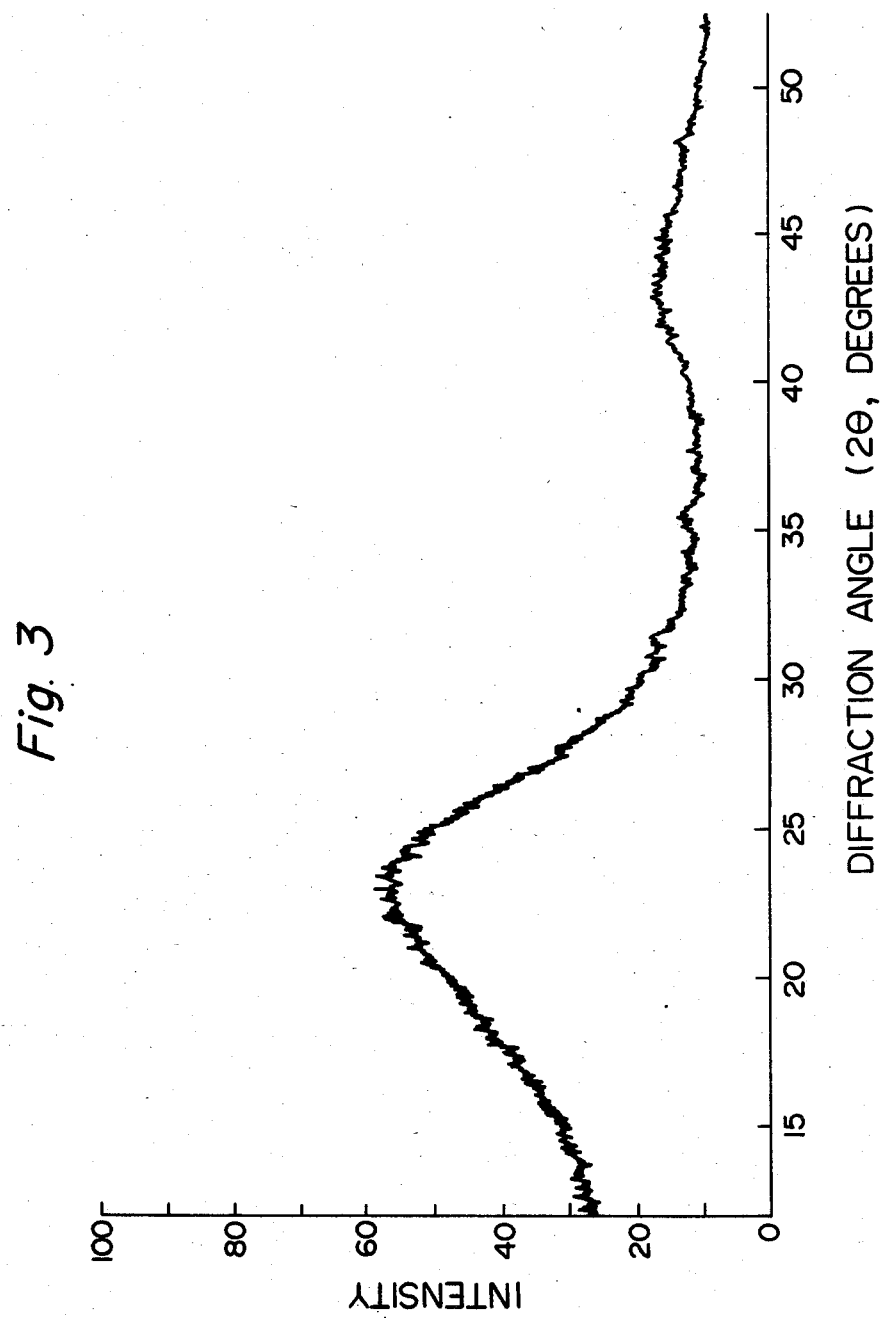

The insoluble and infusible substrate obtained by heat-treating the aromatic condensation polymer shows an X-ray diffraction pattern in which the position of the main peak is shifted to $2\theta = 20.5°$–$23.5°$ (see FIGS. 2 and 3), and a broad peak appears at $2\theta = 41°$–$46°$ (see FIGS. 2 and 3). Presumably, the shifting of the main peak is the shortening of the average distance between planar polyacene-type molecules, and the appearance of the broad peak at $2\theta = 41°$–$46°$ shows the growth of a polyacene-type structure consisting of a multiplicity of linked benzene rings.

In fact, the insoluble and infusible substrate used in this invention preferably has a main peak at $2\theta = 20.5°$–$23.5°$ and a broad peak at $2\theta = 41°$–$46°$ in its X-ray diffraction pattern determined by using $CuK_\alpha$ radiation).

It is said that in an infrared absorption spectrum of an aromatic condensation polymer, an absorption peak appearing in the range of 2900 to 2940 kayser ($cm^{-1}$) corresponds to stretching vibration between carbon not constituting a conjugated system and hydrogen bonded to it, and an absorption peak appearing in the range of 1560 to 1640 kayser ($cm^{-1}$) corresponds to stretching vibration between two carbons constituting a conjugated system of benzene rings ["Carbon", vol. 4, pages 59–66, Pergamon Press Ltd., printed in Great Britain].

Figure 4:
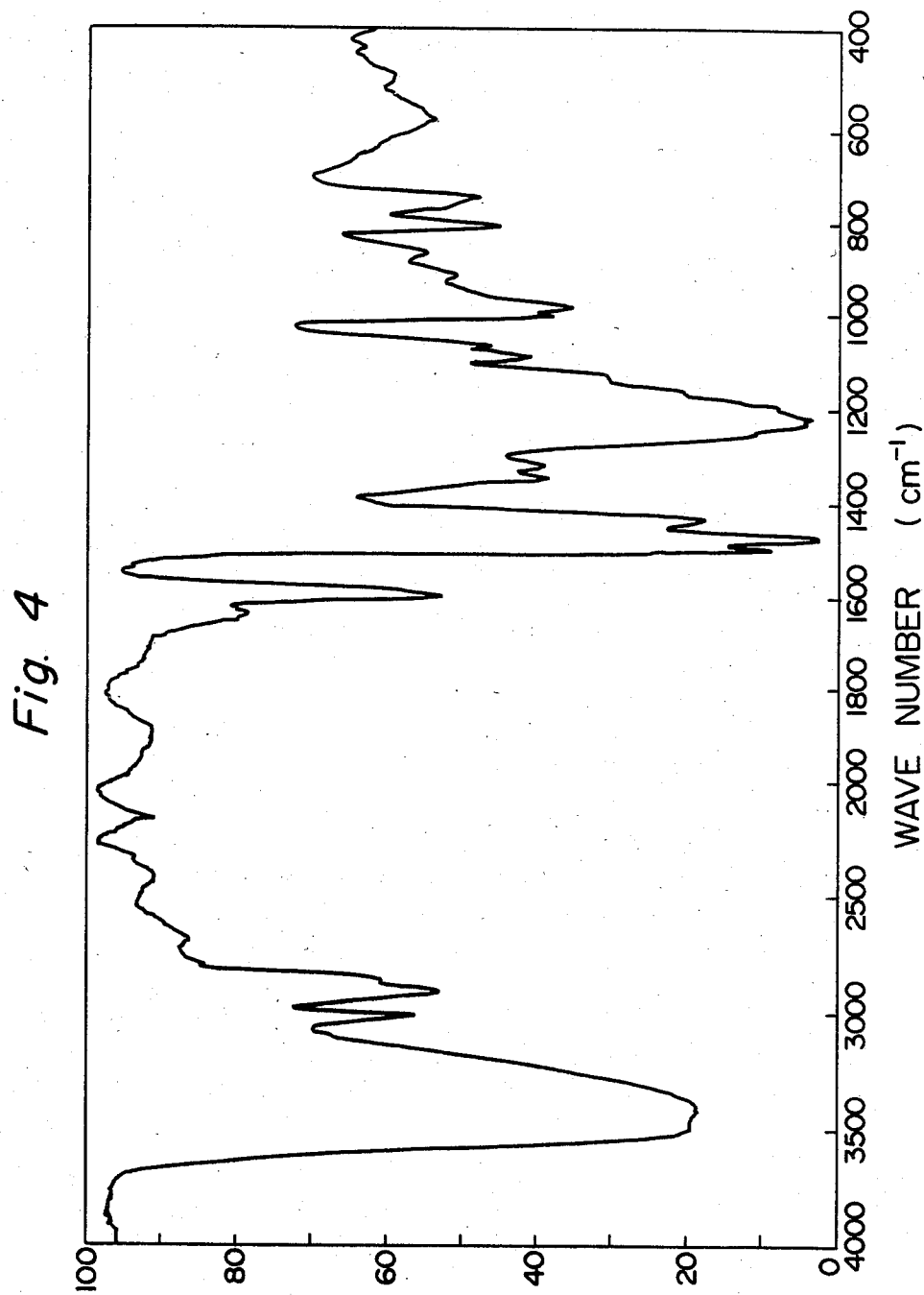
FIG. 4 is an infrared absorption spectrum of a film of a cured phenolic resin which is one example of the aromatic condensation polymer used in the process of this invention.
Figure 5:
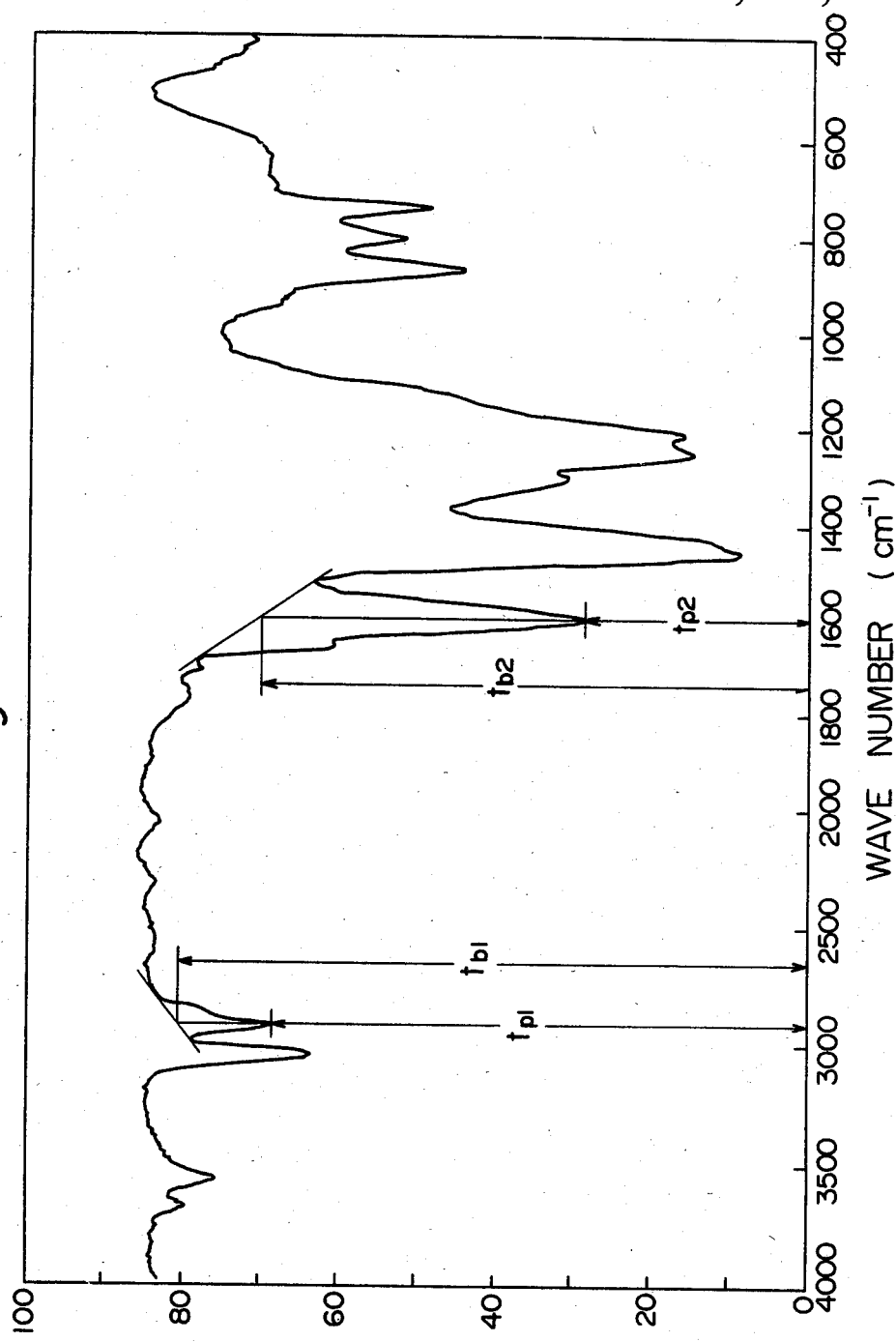
FIGS. 5 and 6 are infrared absorption spectra of insoluble and infusible substrate used in this invention.
Figure 6:
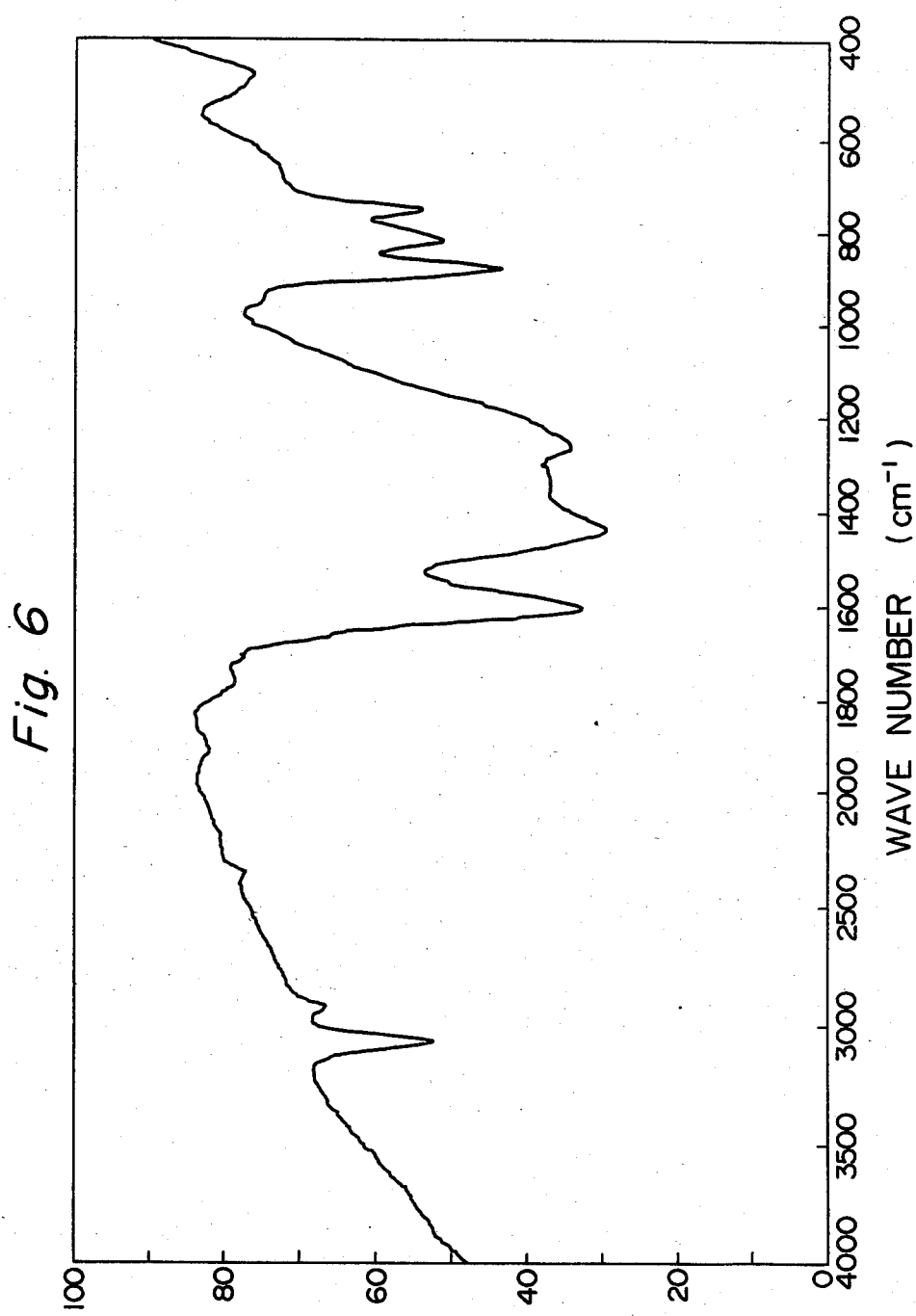

When the aromatic condensation polymer is heat-treated in accordance with the process of this invention, the absorption peak in the range of 2900 to 2940 kayser decreases, as can be seen from the examples shown in FIGS. 4, 5 and 6. When the polymer is an aromatic fused-type polymer having benzene rings, the absorption peak in the range of 1560 to 1640 kayser increases at this time. When the polymer is an aromatic fused-type polymer, such as a furan resin, a new absorption peak appears in the range of 1560–1640 kayser at this time. This fact also demonstrates that the insoluble and infusible substrate used in the present invention has a polyacene-type structure grown and developed as compared with the aromatic condensation polymer before the heat-treatment.

Preferably, the insoluble and infusible substrate used in this invention has an absorbance ratio D, as defined below, of not more than 0.5, especially not more than 0.3.

$$D = D_{2900-2940}/D_{1560-1640}$$

In this expression, $D_{2900-2940}$ is the absorbance determined from the maximum absorption peak in the range of 2900 to 2940 kayser in the infrared absorption spectrum of the substrate, and $D_{1560-1640}$ is the absorbance determined from the maximum absorption peak in the range of 1560 to 1640 kayser.

A detailed description of the method of calculating the absorbance ratio D will be given in Example 1 hereinbelow.

According to the process of this invention, the electrically conductive organic polymeric material can be produced by heating an aromatic condensation polymer to a temperature of 400° to 800° C. in a non-oxidizing atmosphere to form a substrate having a hydrogen/carbon atomic ratio of from 0.60 to 0.15, and then doping the substrate with an electron donating dopant, an electron accepting dopant, or a mixture of these, thereby making the electrical conductivity of the resulting product higher than that of the undoped substrate.

As previously stated, a condensate of an aromatic hydrocarbon compound having a phenolic hydroxyl group and an aldehyde is preferred as the aromatic condensation polymer. Examples of the aromatic hydrocarbon compound are phenols such as phenol, cresol or xylenol, methylenebisphenols, hydroxybiphenyls and hydroxynaphthalenes. Phenol is especially preferred.

Examples of the aldehyde are formaldehyde, acetaldehyde and furfural, and formaldehyde is especially preferred.

A novolak-type or resol-type phenol-formaldehyde resin is preferably used as the aromatic condensation polymer.

The aromatic condensation polymer can be produced in accordance with a method known per se by, for example, condensing an aromatic hydrocarbon compound having a phenolic hydroxyl group and an aldehyde in the presence of an acidic or basic catalyst.

For example, a novolak-type phenol-formaldehyde resin is produced by reacting phenol with formaldehyde in the presence of an acid catalyst such as oxalic acid while maintaining the mole ratio of phenol to formaldehyde at 1:0.7–0.9. The novolak-type phenolic resin obtained by this method consists, as main components, tri-, tetra- and pentamers resulting from the linking of phenol moieties mainly by methylene groups and scarcely contains a free methylol group. Hence, it is not self-crosslinkable and is thermoplastic. This polymer or fibers, films or particulate materials derived from it are especially suitable as the aromatic condensation polymer of this invention.

A resol-type phenol-formaldehyde resin can be produced by reacting phenol with formaldehyde in the presence of a basic catalyst such as sodium hydroxide while maintaining the mole ratio of phenol to formaldehyde at 1:1–2. The resol-type phenolic resin obtained by this method consists of mono-, di- and trimers of phenol having a relatively large amount of free methylol groups as main components, and is crosslinked by simply heating it.

It is advantageous that the aromatic condensation polymer is preferably molded into fibers, films, plates, or composites of these, and then heated in a nonoxidizing atmosphere. Advantageously, these molded articles are subjected to a curing reaction before the heat-treatment in order to stabilize their molecular structure and shape.

Such molding and curing reaction can also be performed, for example, by mixing a methanol solution of the novolak-type phenolic resin with a suitable amount of formalin, casting the solution onto a flat base plate to form a film, and heating the film in the presence of a hydrochloric acid catalyst to cure it. It is possible also to include a crosslinking agent which is at once a formaldehyde generator and an organic base generator, such as hexamethylenetetramine in the novolak-type phenolic resin, form a film from the resin, and then to heat-cure it to form a cured phenolic resin film. Or a cured phenolic resin film can be easily obtained in the same way as above using the resol-type phenolic resin.

Alternatively, a cured phenolic resin plate may be obtained as a composite by impregnating a cloth of phenolic resin fibers (for example, Kaynol, a tradename for a product of Nippon Kynol Inc.) with a methanol solution of the resol-type phenolic resin, removing methanol by air drying, etc., and curing the resin at a temperature of, for example, 120° to 170° C., and a pressure of, for example, 50 to 150 kg/cm$^2$ for 3 to 60 minutes.

The cured product obtained by the above molding-curing operations is then heated in a nonoxidizing atmosphere to give an insoluble and infusible substrate which does not melt when heat-treated and has the shape imparted to the cured product.

According to the process of this invention, the aromatic condensation polymer or its cured product is first heated in a nonoxidizing atmosphere to a temperature of 400° to 800° C. The heating temperature is preferably 450° to 750° C., especially preferably 500° to 700° C.

The preferred rate of temperature elevation at the time of the heat-treatment differs somewhat depending upon the type of the aromatic condensation polymer, the degree of its curing treatment, its shape, etc. Generally, at a temperature of from room temperature to about 300° C., the rate of temperature elevation can be made relatively high, and may, for example, be 100° C./hour. At a temperature above 300° C., the heat decomposition of the aromatic condensation polymer begins and water vapor (H$_2$O), hydrogen, methane, carbon monoxide and other gases begin to be evolved. Hence, the temperature is advantageously elevated at a sufficiently low rate. For example, in the case of a nonporous molded article of the aromatic condensation polymer, the preferred rate of temperature elevation is not more than 80/h$^2$°C. per hour, in which h represents the thickness in mm of the molded article. By using such a rate of temperature elevation, it is easy to control the H/C ratio of the resulting insoluble and infusible substrate to 0.60–0.15 and to stabilize its electrical conductivity mechanical properties.

The heat-treatment of the aromatic condensation polymer is carried out in a non-oxidizing atmosphere. The non-oxidizing atmosphere is, for example, nitrogen, argon, helium, neon, and carbon dioxide. Nitrogen is preferably used. The non-oxidizing atmosphere may be stationary or flowing.

Thus, by the above heat-treatment, an insoluble and infusible substrate having an H/C atomic ratio of 0.60 to 0.15 can be produced. If the heat-treating temperature is lower than 400° C., heat decomposition is insufficient, and if it is higher than 800° C., heat decomposition becomes too vigorous. In either case, it is extremely difficult, or impossible, to obtain an insoluble and infusible substrate having the aforesaid H/C ratio.

Preferably, the insoluble and infusible substrate has an H/C ratio of from about 0.50 to about 0.25. Usually, it has an O/C ratio of not more than 0.06, preferably not more than 0.03. According to its X-ray diffraction analysis (CuK$_\alpha$), a main peak exists at $2\theta = 20.5°$–$23.5°$, and a broad peak exists at $2\theta = 41°$–$46°$ C. In its infrared absorption spectrum, the substrate used in this invention had a D ($D_{2900-2940}/D_{1560-1640}$) ratio of usually not more than 0.5, preferably not more than 0.3.

It is understood that the insoluble and infusible substrate has a uniformly and moderately developed polyacene-type structure between polyacene-type molecules.

According to the process of this invention, the resulting insoluble and infusible substrate is then doped with an electron donating dopant, an electron accepting dopant, or a mixture of the two.

A substance which easily liberates an electron is used as the electron donating dopant. Examples of suitable electron donating dopants are metals of Group IA of the periodic table such as lithium, sodium, potassium and rubidium.

A substance which easily accepts an electron is used as the electron accepting dopant. Examples of preferred electron accepting dopants include halogen atoms such as fluorine, chlorine, bromine and iodine, halogen compounds such as AsF$_5$, PF$_5$, BF$_3$, BCl$_3$ and BBr$_3$, oxides of non-metallic elements such as SO$_3$ and N$_2$O$_5$, and anions derived from inorganic acids such as H$_2$SO$_4$, HNO$_3$ and HClO$_4$.

Doping of the substrate with such a dopant may be carried out in essentially the same way as the doping methods heretofore been used to dope polyacetylene and polyphenylene. The only difference is that in the present invention, the doping can be carried out under stronger conditions than those heretofore known, for example at a temperature of 100° to 200° C. This is because the insoluble and infusible substrate used in this invention is very stable to oxygen and to various other chemicals. Accordingly, the doping can be performed advantageously with good efficiency as compared with the conventional known doping methods.

When the dopant is an alkali metal, the substrate can be doped by contacting it with a molten alkali metal or a vapor of the alkali metal. Or the insoluble and infusible substrate can be contacted with an alkali metal-naphthalene complex formed in tetrahydrofuran.

When the dopant is a halogen, a halogen compound or a non-metallic element oxide, the substrate can be easily doped by contacting it with a gas of such a dopant.

When the dopant is an anion derived from an inorganic acid, the substrate can be doped by coating or impregnating it directly with the inorganic acid, or by performing electrolysis in an electrolyte solution containing the inorganic acid using the substrate as an anode.

Generally, the doping agent is used such that it exists in the resulting organic polymeric material of this invention in a proportion of at least 10$^{-5}$ mole per recurring unit of the aromatic condensation polymer.

Thus, the organic polymeric material of this invention has a higher electrical conductivity than the insoluble and infusible substrate before the doping, preferably 10 times or more as high as the latter. By suitable methods, the electrical conductivity of the resulting organic polymeric material of this invention is $10^3$ to $10^6$ or more as high as that of the undoped substrate.

The electrically conductive organic polymeric material of this invention doped with an electron donating dopant has the electrical conductivity of an n-type (excessive conduction electron density type) semiconductor or a conductor. The electrically conductive organic polymeric material of this invention doped with an electron accepting dopant has the electrical conductivity of a p-type (excessive hole density type) semiconductor or a conductor.

Accordng to this invention, a mixture of an electron donating dopant and an electron accepting dopant can also be used as the doping agent. The electrically conductive organic polymeric material of this invention in which these doping agents are present in a substantially uniformly mixed condition is of p-type or n-type depending upon which of the doping agents is present in excess. For example, if the electron donating dopant is present in excess, the resulting material is of n-type, and if the electron accepting dopant is present in a larger proportion, the resulting material is of p-type. This type of electrically conductive organic polymeric material can be produced by contacting the substrate with a mixture of the two types of doping agents, or contacting the substrate first with one of these doping agents and then with the other.

According to this invention, there can also be produced an electrically conductive organic polymeric material having a p-n junction. It can be produced by doping one side of the insoluble and infusible substrate with an electron donating dopant and its other side with an electron accepting dopant; or by doping the entire surface of the substrate with one of these dopants and then doping only a part of that surface with the other dopant.

Preferably, the electrically conductive organic polymeric material obtained by this invention has a direct-current conductivity at room temperature of at least $10^{-4}$ ohm$^{-1}$cm$^{-1}$.

Presumably, the electrical conductivity of the organic polymeric material of this invention is increased by the electronic interaction between the polyacene-type skeletal structure of the polymeric material and the electron donating doping agent, or the electron accepting doping agent, or a mixture of these.

For example, when the undoping insoluble and infusible substrate having an electrical conductivity of $10^{-12}$ ohm$^{-1}$cm$^{-1}$ is doped with iodine, its electrical conductivity increases to about $10^{-3}$ ohm$^{-1}$cm$^{-1}$, and in an infrared absorption spectrum of this organic polymeric material, a peak not observed in the undoped substrate appears. When the undoped insoluble and infusible substrate having an electrical conductivity of about $10^{-6}$ ohm$^{-1}$cm$^{-1}$ is doped with iodine, its electrical conductivity increases to about $10°$ ohm$^{-1}$cm$^{-1}$, and in its infrared absorption spectrum, a peak (1560-1640 cm$^{-1}$) corresponding to stretching vibration between carbons constituting a conjugated system is shifted to a higher wavelength.

Generally, the insoluble and infusible substrate used in this invention is a material having a black luster. But when, for example, it is doped with sulfur trioxide, it turns to a violet luster. When it is doped with sodium, it turns to a gold luster. From these phenomena, it appears quite sure that in the electrically conductive organic polymeric material of this invention, an electronic interaction exists between the polyacene-skeletal structure and the doping agent and therefore, its electrical conductivity is greatly increased.

The insoluble and infusible substrate used in this invention shows the electrical conductivity of an insulator or semiconductor. But since its polyacene-type skeletal structure constituting a conjugated system is in the grown state, doping of it with a doping agent gives an electrically conductive organic polymeric material having a greatly increased electrical conductivity. For example, when the insoluble and infusible substrate having an electrical conductivity of $10^{-12}$ohm$^{-1}$ cm$^{-1}$ is doped with iodine, an organic polymeric material in accordance with this invention having an electrical conductivity of about $10^{-3}$ ohm$^{-1}$ cm$^{-1}$ is obtained. In contrast, when polyphenylene having an electrical conductivity of $10^{-11}$ ohm$^{-1}$ cm$^{-1}$ is doped with halogen as described in the published specification of Japanese Laid-Open Patent Publication No. 129443/1980, its electrical conductivity increases only to $10^{-7}$ ohm$^{-1}$ cm$^{-1}$.

The insoluble and infusible substrate used in this invention has excellent stability to oxygen, and for example, when it is left to stand in air at room temperature for 5,000 hours, its properties scarcely change and its electrical conductively remains substantially the same. Furthermore, it has high mechanical strength, as demonstrated by its flexural strength of generally at least 300 kg/cm$^2$ which is sufficient for practical purposes.

The electrically conductive organic polymeric material of this invention takes over the properties of the insoluble and infusible substrate and shows the same properties.

The electrically conductive organic polymeric material of this invention is formed as a film, a fiber, a plate, or a a composite of these. It may be used in various applications, for example, as rectifier diodes, transistors, solar cells, electrodes of batteries, etc.

The following examples illustrate the present invention more specifically.

EXAMPLE 1

(1) A solution consisting of a mixture of a novolak-type phenol resin, methanol and formalin (about 37% aqueous solution) in a weight ratio of 3:3:1 was cast on a glass plate, and spread by means of an applicator. The film was then dried in the air for about 30 minutes to remove methanol. While adhering to the glass plate, the film was put in 5N hydrochloric acid and cured at 70° C. for 90 minutes. The cured film was fully washed with warm water, and dried in air for about 1 day to give a cured phenolic resin film having a thickness of 10 microns.

The resin film was put in an electric furnace having a silicon carbide electrode, and heat-treated in a nitrogen atmosphere by heating it to each of the predetermined temperatures shown in Table 1 at a rate of about 40° C./hr to give an insoluble and infusible film-like substrate. The elemental analysis, X-ray diffraction, infrared spectral analysis, and electrical conductivity measurement of the cured phenolic resin film and the resulting film-like substrate were carried out, and the results are shown in Table 1 together with an indication of the colors of the resulting samples.

FIGS. 1, 2 and 3 show X-ray diffraction patterns of the cured phenolic resin film, the substrate sample No. 3, and the substrate sample No. 5. In FIGS. 1 to 3, the abscissa represents the diffraction angle ($2\theta$, degrees), and the ordinate, the intensity. FIGS. 4 to 6 show infrared absorption spectra of the cured phenolic resin film, the substrate sample No. 3 and the substrate sample No. 4 (measured by using the film substrates themselves).

FIG. 5 also shows how to determine the absorbance ($D_{2900-2940}$) of the peak at 2900-2940 cm$^{-1}$ and the absorbance ($D_{1540-1640}$) of the peak at 1560-1640 cm$^{-1}$.

$D_{2900-2940}$ is calculated from the following equation after determining $t_{p1}$ and $t_{b1}$ as illustrated.

$$D_{2900-2940} = \log \frac{t_{p1}}{t_{b1}}$$

Likewise, $t_{p2}$ and $t_{b2}$ are determined as illustrated, and $D_{1560-1640}$ is calculated from the following equation.

$$D_{1560-1640} = \log \frac{t_{p2}}{t_{b2}}$$

There was scarcely any difference between them (see Table 2).

The doped film-like samples were analyzed by infrared absorption spectroscopy, and the resulting spectra were compared with that before the doping. In all of the samples, the peak (in the vicinity of 1560-1640 cm$^{-1}$) corresponding to stretching vibration between carbon atoms constituting a conjugated system was shifted to a higher wavelength. This phenomenon indicates that an electron interaction takes place between iodine and the polyacene-type molecules. In the spectrum of the sample No. 3, a new peak not seen in the sample before doping appeared at about 1700 cm$^{-1}$. Since this absorption is not based on iodine as the doping agent, this phenomenon also indicates that an electron interaction takes place between iodine and the polyacene-type molecules. Table 2 shows the electrical conductivities of the samples during the doping, immediately after they were taken out into the air, and after they were left to stand in air for 2,000 hours.

TABLE 1

| No. | Heat-treating temperature (°C.) | H/C ratio | O/C ratio | X-ray diffraction Maximum peak ($2\theta$, degrees) | X-ray diffraction Magnitude of the peak at $2\theta = 41-46°$ | Absorbance ratio (D) in IR spectrum | Electrical conductivity (ohm$^{-1}$ cm$^{-1}$) | Color |
|---|---|---|---|---|---|---|---|---|
| Cured resin film | phenolic film | 0.97 | 0.17 | 19.6 | None | 0.71 | — | Pink |
| 1 | 500 | 0.60 | 0.06 | 20.5 | Small | 0.34 | $10^{-12}$ | Deep brown |
| 2 | 540 | 0.51 | 0.04 | 20.8 | Medium | 0.26 | $10^{-12}$ | Black |
| 3 | 560 | 0.43 | 0.021 | 21.1 | Medium | 0.17 | $10^{-11}$ | Black |
| 4 | 610 | 0.33 | 0.012 | 22.0 | Medium | 0.06 | $10^{-6}$ | Black |
| 5 | 740 | 0.15 | 0.006 | 23.5 | Large | — | $10^{1}$ | Black |

The broad peaks at $2\theta = 41°-46°$ in the samples Nos. 1 to 5 in Table 1 existed in the vicinity of $2\theta = 43°$.

The electrical conductivity was measured by providing four parallel equally-spaced lead wires in a rectangular sample of the film-like substrate, and separately measuring the voltage and current at room temperature using a dc constant voltage power supply.

It is seen from Table 1 and FIGS. 1 to 6 that by adjusting the heat-treatment temperature to 500° to 740° C., a substrate having a hydrogen to carbon atomic ratio of from 0.60 to 0.15 can be produced. It is seen from the results of X-ray analyses that all of the samples Nos. 1 to 5 have a polyacene type structure, and the average distance between planar polyacene-type molecules is much larger than that of graphite. This average distance between molecules is suitable for inclusion of the doping agent, and an electronic interaction between the polyacene-type molecules and the doping agent takes place.

(2) The undoped film-like substrate was put in a vacuum line, and the degree of vacuum was adjusted to 10$^{-2}$ torr or more. Iodine gas was introduced into the line at room temperature, and the substrate was doped for 30 minutes. Without breaking the vacuum, the electrical conductivity of each sample was measured after performing the doping for 5 minutes, 10 minutes, 20 minutes and 30 minutes (see Table 2). It is seen from Table 2 that all of the samples continuously increased in electrical conductivity during the doping. After performing the doping for about 30 minutes, the iodine gas was removed out of the line, and the doped substrate was maintained in vacuum for about 180 minutes to remove the adhering iodine. The samples were taken out into the air, and their electrical conductivities were compared with those in the line.

TABLE 2

| | Electrical conductivity (ohm$^{-1}$ cm$^{-1}$) | | | | | |
|---|---|---|---|---|---|---|
| No. | 5 minutes | 10 minutes | 20 minutes | 30 minutes | Immediately after taking out in air | 2,000 hours later |
| 1 | $10^{-7}$ | $10^{-5}$ | $10^{-5}$ | $10^{-5}$ | $10^{-5}$ | $10^{-6}$ |
| 2 | $10^{-4}$ | $10^{-3}$ | $10^{-3}$ | $10^{-3}$ | $10^{-3}$ | $10^{-3}$ |
| 3 | $10^{-2}$ | $10^{-2}$ | $10^{-2}$ | $10^{-2}$ | $10^{-2}$ | $10^{-3}$ |
| 4 | $10^{-1}$ | $10^{0}$ | $10^{0}$ | $10^{0}$ | $10^{0}$ | $10^{0}$ |
| 5 | $10^{1}$ | $10^{1}$ | $10^{1}$ | $10^{1}$ | $10^{2}$ | $10^{2}$ |

It is seen from Table 2 that doping with iodine resulted in a great increase in electrical conductivity. It is also noteworthy that the undoped sample having a thickness of about 10 microns can be almost completely doped with a relatively short period of time. It was ascertained that the resulting electrically conductive organic polymeric materials of this invention showed excellent stability to oxygen.

EXAMPLE 2

A plain-weave cloth of phenolic fibers (Kaynol, a trademark for a product of Nippon Kynol Inc.; basis weight 200 g/m$^2$) was dipped in a 40% by weight methanol solution of a resol-type phenolic resin, squeezed by a mangle, and dried at room temperature for 24 hours to prepare a prepreg consisting of the phenolic fibers and the resol-type phenolic resin in a weight ratio of 1:1. The prepreg was cured under a pressure of 150 kg/cm$^2$ for 30 minutes by means of a press-forming machine heated at 150° C. to obtain a plate having a thickness of 250 microns. The plate was heat-treated in an atmosphere of nitrogen by heating it to 300° C. at a rate of 70° C./hour and then to 600° C. at a rate of 10° C./hour. The resulting plate, not doped, had a hydrogen/carbon atomic ratio of 0.31, and an oxygen/carbon atomic ratio of 0.01. Its X-ray diffraction analysis showed that a main peak existed at $2\theta=22.5°$ and another peak, at $2\theta=42°-45°$. In its infrared absorption spectrum, it showed an absorbance ratio $D(=D_{2900-2940}/D_{1560-1640})$ of 0.05.

The resulting plate (thickness about 200 microns) was exposed to an atmosphere of iodine gas at 200° C. to dope it with iodine for about 30 minutes starting at its surface. After the doping, the electrical conductivity of the doped plate showed an increase of about $10^5$ times from that before the doping. In order to examine the doping condition of iodine in the interior of the plate after the doping, the doped sample was analyzed by an electron microanalyzer (EMAX). It was found that iodine penetrated through the sample to a depth of about 40 microns from its surface, and the presence of iodine was noted in an outside layer having a boundary at this depth. In other words, while the interior portion remained an intrinsic semiconductor, the outside layer above this boundary was a p-type semiconductor.

EXAMPLE 3

The sample No. 4 prepared in Example 1 which was a film having an electrical conductivity of about $10^{-6}$ ohm$^{-1}$ cm$^{-1}$ and a thickness of about 10 microns was put in a vacuum line. After evacuation to adjust the degree of vacuum to $10^{-2}$ torr or more, $SO_3$ gas was introduced into the line. After the introduction of $SO_3$, the electrical conductivity of the sample began to increase abruptly, and in about 20 minutes, reached $10^1$ ohm$^{-1}$ cm$^{-1}$. The film was taken out into the air, and dried at about 60° C. for 24 hours in a vacuum dryer. The dried sample was taken out, and its electrical conductivity was measured. It decreased to about $10^{-1}$ ohm$^{-1}$ cm$^{-1}$. The sample was again dried for about 72 hours in the vacuum dryer at the same temperature, and then its electrical conductivity was measured. It was about $10^{-1}$ ohm$^{-1}$ cm$^{-1}$. It could be ascertained that this electrical conductivity no longer changed even when the sample was taken out into the air. After the drying, the sample had a violet luster, whereas it had a black color before the doping.

EXAMPLE 4

Electrolytic doping was performed by using the sample film No. 4 prepared in Example 1 and having an electrical conductivity of about $10^{-6}$ ohm$^{-1}$ cm$^{-1}$ as an anode and a carbon plate as a cathode in an electrolytic solution prepared by dissolving about 1 mole of LiClO$_4$ in 1 liter of propylene carbonate.

Immediately after application of voltage, the electric current was about 0.01 mA. It increased to about 0.2 mA in 15 minutes and then to about 3 mA in about 2 hours. Immediately after the current reached about 3 mA, the sample was taken out from the electrolytic solution, washed several times with acetone, and dried under reduced pressure at room temperature. The dried sample was found to have an electrical conductivity of about $10^{-3}$ ohm$^{-1}$ cm$^{-1}$ which was about $10^3$ times as high as that ($10^{-6}$ ohm$^{-1}$ cm$^{-1}$) before the doping. The dried sample showed an indigo blue luster.

EXAMPLE 5

A tetrahydrofuran solution of sodium naphthalate was prepared by using dehydrated tetrahydrofuran, naphthalene and metallic sodium. In a dry box (in a stream of nitrogen gas), the sample No. 4 prepared in Example 1 was dipped to perform doping at room temperature. After dipping for about 10 hours, the sample was washed with dehydrated tetrahydrofuran in the dry box. Then, the sample was dried at room temperature under a reduced pressure of about $10^{-2}$ torr for about 20 hours. The dried sample had a golden luster, while before the doping, it had a black luster. The dried sample had an electrical conductivity of about $10^{-1}$ ohm$^{-1}$ cm$^{-1}$.

EXAMPLE 6

Using the same undoped plate (thickness about 200 microns) as used in Example 2, changes of its electrical conductivity with temperature were examined over a temperature range of about $-100°$ C. to 20° C. As in general semiconductors, the relation between the electrical conductivity and the temperature was substantially linear when plotting the reciprocal of the temperature on the abscissa and the logarithm of the electrical conductivity on the ordinate. In other words, the electrical conductivity increased with increasing temperature. The energy gap $\Delta E$ was calculated from this relation, and found to be about 0.55 electron volt.

The plate-like sample was exposed to an atmosphere of iodine gas for about 60 minutes to dope it. Changes of the electrical conductivity of the doped sample with temperature were also examined. It was found that the electrical conductivity of the doped sample increased with increasing temperature. When the reciprocal of the temperature was plotted on the abscissa and the logarithm of the electrical conductivity, on the ordinate, a substantially linear relation was obtained. The energy gap $\Delta E$ was about 0.15 electron volt.

EXAMPLE 7

A cresol resin in solution form (cresol-formaldehyde resin, heat-curable type; PR-912, a trademark for a product of Sumitomo Durez Co., Ltd.) was cast on a glass plate and spread by an applicator. It was then dried in the air for about 2 hours, and then heat-cured at 150° C. for 30 minutes to give a film having a thickness of about 30 microns. The film was then placed in an electrical furnace having a silicon carbide electrode, and heat-treated in a stream of nitrogen from room temperature to 610° at a rate of about 40° C./hour to give an insoluble and infusible substrate in film form. The film-like substrate was subjected to elemental analysis, X-ray diffraction analysis, infrared spectroscopy and measurement of electrical conductivity. In its X-ray diffraction pattern, the highest peak appeard at $2\theta=22.7°$, and the magnitude of a peak at $2\theta=41°-46°$ was medium. In its infrared absorption spectrum, an absorption at 2900–2940 cm$^{-1}$ was so small as to be scarcely perceptible, and a clear absorption was observed at 1560 to 1640 cm$^{-1}$. Evidently, the substrate had an absorbance ratio ($D_{2900-2940}/D_{1560-1640}$) of less than 0.3. Its electrical conductivity was $10^{-3}$ ohm$^{-1}$cm$^{-1}$.

The film-like substrate was then put in a vacuum line, and doped with iodine for about 30 minutes in the same way as in Example 1. Changes in the electrical conductivity of the substrate during the doping were examined. After the 30-minute doping, the electrical conductivity of the sample increased to $10^{-1}$ ohm$^{-1}$cm$^{-1}$.

The results are shown in Table 3.

EXAMPLE 8

A solution of a xylene-modified phenol-formaldehyde resin (phenol/xylene=1:1 by mole; heat-curable type; PR-1440M, a trademark for a product of Mitsubishi Gas Chemical Co., Inc.) was cast on a glass plate, and spread by means of an applicator. It was dried in the air for about 2 hours, and heat-cured at 150° C. for about 2 hours to give a film having a thickness of about 50 microns. The film was then put in an electrical furnace having a silicon carbide electrode, and heat-treated in a stream of nitrogen by heating it from room temperature to 610° C. at a rate of about 40° C./hour to give an insoluble and infusible substrate in film form.

The film-like substrate was then put in a vacuum line, and doped with iodine for about 30 minutes in the same way as in Example 1. The results are shown in Table 3.

In an infrared absorption spectrum of the film-like substrate (undoped), an absorption at 2900–2940 cm$^{-1}$ was so small as to be scarcely perceptible, and its absorbance ratio ($D_{2900-2940}/D_{1560-1640}$) was evidently below 0.3.

EXAMPLE 9

A furan resin (furfuryl alcohol resin, Hitafuran 302, a trademark for a product of Hitachi Chemical Co., Ltd.) was cast on a glass plate, and spread by an applicator. It was then dried in the air for about 2 hours, and heated at 100° C. for about 2 hours to give a film having a thickness of about 40 microns. The film was placed in an electrical furnace having a silicon carbide electrode, and heat-treated in a stream of nitrogen by heating it from room temperature to 640° C. at a rate of about 40° C./hour to give an insoluble and infusible substrate in film form.

The film-like substrate was put in a vacuum line and doped with iodine for about 30 minutes in the same way as in Example 1.

The results are shown in Table 3.

An infrared absorption spectrum of the film-like substrate before the doping evidently showed that its absorbance ratio ($D_{2900-2940}/D_{1560-1640}$) was below 0.3.

insoluble and infusible film-like substrate. The film-like substrate had a hydrogen/carbon atomic ratio of 0.36 and an oxygen/carbon atomic ratio of 0.013. In its X-ray diffraction pattern, the highest peak appeared at $2\theta=21.3°$, and the magnitude of a peak at $2\theta=41°-46°$ was medium. It had an absorbance ratio ($D_{2900-2940}/D_{1560-1640}$) of 0.10, and an electrical conductivity of $10^{-7}$ ohm$^{-1}$cm$^{-1}$.

The film-like substrate was doped with sodium in the same way as in Example 5. The doped substrate had a golden luster, and an electrical conductivity of $10^{-2}$ ohm$^{-1}$cm$^{-1}$.

Separately, a polyacetylene film obtained by a known method (cis-type; silver in color; about 80 microns in thickness; electrical conductivity $10^{-8}$ ohm$^{-1}$cm$^{-1}$) was doped with sodium in the same way as above. The doped film had a golden luster and an electrical conductivity of $10^{-2}$ ohm$^{-1}$cm$^{-1}$.

The results show that the electrically conductive organic polymeric material obtained by using an insoluble and infusible substrate having a new polyacene-type skeletal structure in accordance with this invention has excellent electrical conductivity equivalent to the known polyacetylene. The material of this invention is superior for practical purposes in view of the fact that it has much higher oxidation stability than the polyacetylene.

What we claim is:

1. An electrically conductive organic polymeric material comprising (a) an infusible, insoluble substrate having a polyacene skeletal structure and having a hydrogen/carbon atomic ratio in the range of 0.60 to 0.15, said substrate having been prepared by heating an aromatic condensation polymer consisting of carbon, hydrogen and oxygen to a temperature in the range of 400° C. to 800° C. in a non-oxidizing atmosphere, said aromatic condensation polymer being selected from the group consisting of (1) condensation products of aromatic hydrocarbon compounds having a phenolic hydroxyl group with aldehydes, (2) condensation products of a mixture of aromatic hydrocarbon compounds having a phenolic hydroxyl group and aromatic hydro-

TABLE 3

| | | | Film-like substrate before the doping | | | | Electrical conductivity after doping (ohm$^{-1}$ cm$^{-1}$) |
|---|---|---|---|---|---|---|---|
| | | | X-ray diffraction | | | Electrical | |
| Example | H/C ratio | O/C ratio | Highest peak ($2\theta$, degrees) | Magnitude of a peak at $2\theta = 41-46°$ | Color | conductivity (ohm$^{-1}$ cm$^{-1}$) | |
| 7 | 0.32 | 0.020 | 22.7 | Medium | Black | $10^{-3}$ | $10^{-1}$ |
| 8 | 0.33 | 0.017 | 21.5 | Medium | Black | $10^{-4}$ | $10^{-1}$ |
| 9 | 0.30 | 0.017 | 22.0 | Medium | Black | $10^{-4}$ | $10^{-1}$ |

EXAMPLE 10

A cured phenolic resin film having a thickness of about 30 microns was heat-treated to 610° C. in the same way as in Example 1 to give a film-like substrate having an electrical conductivity of $10^{-7}$ ohm$^{-1}$cm$^{-1}$. The film-like substrate was put in a vacuum line, and the degree of vacuum was adjusted to about $10^{-2}$ torr. Bromine gas was introduced into the line at room temperature to dope the sample for about 30 minutes. The doped sample had an electrical conductivity of about $10^{-1}$ ohm$^{-1}$cm$^{-1}$.

EXAMPLE 11

A cured phenolic resin film having a thickness of 10 microns prepared in the same way as in Example 1 was heat-treated by heating it to 590° C. to give a black carbon compounds free of phenolic hydroxyl groups with aldehydes, and (3) furan resins; and (b) an effective amount of a doping agent selected from the group consisting of electron donating doping agents, electron accepting doping agents, and mixtures thereof, said doping agent being absorbed into said substrate and being effective to increase the electrical conductivity of said substrate.

2. The material of claim 1 wherein said aromaic condensation polymer is a condensation product of phenol and formaldehyde.

3. The material of claim 1 wherein said polyacene-skeletal structure was a hydrogen/carbon atomic ratio of from 0.50 to 0.25.

4. The material of claim 1, claim 2 or claim 3 wherein said polyacene skeletal structure has an oxygen/carbon atomic ratio of not more than 0.06.

5. The material of claim 1, claim 2 or claim 3 wherein said polyacene skeletal structure has an oxygen/carbon atomic ratio of not more than 0.03.

6. The material of claim 1, claim 2 or claim 3 wherein, in an X-ray diffraction pattern of the substrate (a) determined by using $CuK_\alpha$ radiation, a main peak exists at $2\theta = 20.5°-23.5°$.

7. The material of claim 1, claim 2 or claim 3 wherein, in an X-ray diffraction pattern of the substrate (a) determined by using $CuK_\alpha$ radiation, a peak exists at $2\theta = 41°-46°$.

8. The material of claim 1, claim 2 or claim 3 wherein the substrate (a) has an absorbance ratio D of not more than 0.5, as determined from its infrared absorption spectrum and defined by the following equation:

$$D = D_{2900-2940}/D_{1560-1640}$$

wherein $D_{2900-2940}$ is the absorbance determined from the maximum absorption peak in the range of 2900 to 2940 kayser of said infrared absorption spectrum, and $D_{1560-1640}$ is the absorbance determined from maximum absorption peak in the range of 1560 to 1640 kayser of said infrared absorption spectrum.

9. The material of claim 8 wherein the absorbance ratio D of the substrate (a) is not more than 0.3.

10. The material of claim 1, claim 2 or claim 3 wherein said material has a direct-current electrical conductivity at room temperature of at least $10^{-4}$ $ohm^{-1}cm^{-1}$.

11. The material of claim 1, claim 2 or claim 3 wherein said doping agent is a metal of Group IA of the periodic table selected from lithium, sodium, potassium, rubidium and cesium.

12. The material of claim 1, claim 2 or claim 3 wherein said doping agent is a halogen selected from fluorine, chlorine, bromine and iodine.

13. The material of claim 1, claim 2 or claim 3 wherein said doping agent is selected from the group consisting of $AsF_5$, $PF_5$, $BF_3$, $BCl_3$ and $BBr_3$.

14. The material of claim 1, claim 2 or claim 3 wherein said doping agent is an oxide of a non-metallic element or an anion derived from an inorganic acid.

15. The material of claim 1, claim 2 or claim 3 wherein said material is in the form of a molded article.

16. The material of claim 1, claim 2 or claim 3 wherein said material is in the form of a film, a plate, a fiber or composites thereof.

17. A material as claimed in claim 1, wherein said doping agent is present in said material in an amount of at least $10^{-5}$ mole of said doping agent per recurring unit of said aromatic condensation polymer, and said doping agent is selected from the group consisting of Group IA metals, halogens, halogen compounds, oxides of non-metallic elements, and anions derived from inorganic acids.

18. A material as claimed in claim 17, wherein said doping agent increases the electrical conductivity of said substrate by a factor in the range of from $10^3$ to $10^6$.

19. A material as claimed in claim 17, wherein material has a direct current conductivity at room temperature of at least $10^{-4}$ $ohm^{-1}cm^{-1}$.

20. A material as claimed in claim 17, wherein said material consists essentially of said substrate (a) and said doping agent (b).

21. A material as claimed in claim 14, wherein said doping agent is selected from the group consisting of $SO_3$, $N_2O_5$, and anions of $H_2SO_4$, $HNO_3$ and $HClO_4$.

22. A material as claimed in claim 17, wherein said aromatic condensation polymer is heated to a temperature in the range of 500° C. to 700° C. and said substrate has a hydrogen/carbon ratio in the range of 0.50 to 0.25, said heating being carried out for a time sufficient to allow said hydrogen/carbon ratio to reach said range as gases comprising hydrogen, water vapor, methane and carbon dioxide are evolved during said heating.

23. A material as claimed in claim 1, in which said aromatic hydrocarbon compound having a phenolic hydroxyl group is selected from the group consisting of phenol, cresol, xylenol,

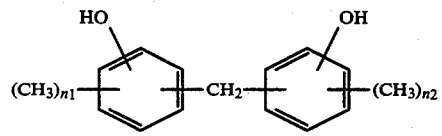

wherein n is an integer of 0 to 2, hydroxy biphenyls and hydroxy naphthalenes, said aldehyde is selected from the group consisting of formaldehyde, acetaldehyde and furfural, and said aromatic hydrocarbon compound free of phenolic hydroxyl groups is selected from the group consisting of xylene and toluene.

* * * * *